United States Patent [19]

Johnston et al.

[11] 4,276,513
[45] Jun. 30, 1981

[54] AUTO-ZERO AMPLIFIER CIRCUIT WITH WIDE DYNAMIC RANGE

[75] Inventors: Craig E. Johnston, Woodinville; Ramesh C. Goyal, Mountlake Terrace, both of Wash.

[73] Assignee: John Fluke Mfg. Co., Inc., Mountlake Terrace, Wash.

[21] Appl. No.: 75,708

[22] Filed: Sep. 14, 1979

[51] Int. Cl.³ .......................... H03F 1/02; H03F 1/00
[52] U.S. Cl. ......................................... 330/9; 330/162
[58] Field of Search .......................... 330/9; 328/162

[56] References Cited

U.S. PATENT DOCUMENTS

| 2,970,266 | 1/1961 | Molloy et al. | 330/9 |
|---|---|---|---|
| 3,015,074 | 12/1961 | Taskett | 330/9 |
| 3,047,797 | 7/1962 | Borsboom | 330/9 |
| 3,070,786 | 12/1962 | MacIntyre | 330/9 |
| 3,265,979 | 8/1966 | Staunton | 330/9 |
| 3,586,989 | 6/1971 | Wheable | 330/51 |
| 3,649,924 | 5/1972 | Lucas | 330/9 |
| 4,025,869 | 5/1977 | Smith | 328/162 |

*Primary Examiner*—Harold A. Dixon
*Attorney, Agent, or Firm*—Christensen, O'Connor, Johnson & Kindness

[57] ABSTRACT

An operational amplifier (33) is continuously switched back-and-forth between an auto-zero mode of operation and an accurate amplification mode of operation. During the auto-zero mode of operation, the junction between an offset voltage compensation (e.g., auto-zero) capacitor (35) and the noninverting input of the operational amplifier (33) is referenced to the input signal voltage via a bootstrap amplifier (31), rather than being tied to ground. Further, during the auto-zero mode of operation, the other end of the auto-zero capacitor (35) is referenced to the output of the operational amplifier (33), which is also connected to the inverting input of the operational amplifier. As a result, the auto-zero capacitor (35) is charged to a voltage level equal to the input offset voltage of the operational amplifier, but in polarity opposition thereto. During the accurate amplification mode of operation, the input signal is applied to the noninverting input of the operational amplifier (33) via the auto-zero capacitor (35). As a result, the charge on the auto-zero capacitor cancels the input offset voltage of the amplifier whereby the output of the operational amplifier (33) is accurately related to the voltage of the input signal by the gain of the operational amplifier. Because the auto-zero capacitor (35) is referenced to the input signal voltage during the auto-zero mode of operation, rather than being tied to ground, voltage swings at the output of the operational amplifier (33) and across the various switch elements (37, 39, 41) are kept low. As a result, the auto-zero amplifier circuit is operable over a wide dynamic range.

29 Claims, 9 Drawing Figures

AUTO-ZERO AMPLIFIER CIRCUIT WITH WIDE DYNAMIC RANGE

BACKGROUND OF THE INVENTION

This invention is directed to electronic amplification circuits and, more particularly, to electronic amplification circuits that include an auto-zero mode of operation.

In many electronic circuits, accuracy of amplifier gain is not as important as the accuracy of the relationship between the shape of the amplified waveform and the waveform of the input signal. Contrariwise, in other circuits, accuracy of amplifier gain is of critical importance. One environment wherein electronic amplifier circuits are required to provide exact gain values is in the measurement of the voltage level of unknown signals. More specifically, for various reasons it is often necessary to amplify or buffer the input signal received by electronic measuring systems prior to measuring the voltage level of the signal. In some instances the voltage level of the input signal is too low for it to be accurately measured. In other instances, the input voltage must be decoupled from its source to prevent source loading. In any event, in order to accurately measure such voltages, the gain of the input amplifier must be accurate and remain accurate regardless of amplifier drift. Further, the amplifier must introduce minimal offset voltage and other errors.

In the past, temperature compensated linear amplifiers and chopper-amplifier circuits have been used in measuring circuits to achieve the required gain accuracy. However, these and other similar, relatively complex, amplifier circuits have the disadvantage that they are expensive to produce and lack reliability due to the number of components included in such circuits.

In an attempt to overcome the disadvantages of relatively complex accurate gain amplifier circuits, electronic measurement systems more recently have included auto-zero amplifier circuits. An auto-zero amplifier circuit is a circuit wherein the input of the amplifier is switched between an auto-zero mode of operation and an amplification mode of operation. During the auto-zero mode of operation, the input signal is referenced to a fixed base line value (usually ground) and a capacitor is charged to a voltage level equal to the input offset voltage of the amplifier. (As will be readily appreciated by those skilled in the electronics art, the input offset voltage of the amplifier varies in accordance with drift, i.e., the input offset voltage is sensitive to various parameters, such as temperature, power supply voltage, time, etc.) The capacitor charge is then utilized to counteract the effect of input offset voltage errors during the amplification mode of operation, whereby the input signal is accurately amplified. In other words, auto-zero amplifier circuits do not depend on the accuracy of the amplifier. Rather, such circuits use a relatively inaccurate amplifier, but store a signal related to the inaccuracy of the amplifier. The stored signal is then used to compensate for amplifier inaccuracy during an amplification mode of operation.

While prior art auto-zero amplifier circuits have overcome many of the disadvantages of the expensive, complicated amplifiers utilized in the past, prior art auto-zero amplifier circuits also have disadvantages. Specifically, prior art auto-zero amplifier circuits have had a very limited dynamic range because they have to reference the auto-zero capacitor to ground (or some fixed voltage value) during the auto-zero mode of operation. This arrangement has resulted in the level of the voltages at the input and output terminals of the amplifier continuously swinging between the signal voltage level (during the amplification mode of operation) and ground or a fixed voltage value (during the auto-zero mode of operation). These relatively large voltage swings cause a number of problems. Specifically, large voltage swings create spikes and noise proportional to the magnitude of the common-mode swing, resulting in offset voltage errors, gain errors and noise in the output voltage. In addition, any common mode amplifier errors present in the signal, such as common-mode rejection ratio errors, are not improved because the auto-zero mode of operation is referenced to a fixed level (e.g. ground), which is independent of the input signal level. Further, because a trade-off exists between the large voltage signal swings and fast auto-zero speeds due to the time required for the amplifier to swing between the input signal level and the auto-zero level, and stabilize, limitations are placed on amplifier slew rate and bandwidth. Further, in conventional auto-zero amplifier circuits, switching between the auto-zero mode of operation and the accurate amplification mode of operation is accomplished using junction field effect transistor (JFET) or metal oxide semiconductor field effect transistor (MOSFET) switches. Since the voltage swings occur across the switching devices, the voltage rating of the switching devices limit acceptable voltage swings and, thus, the dynamic range of prior art auto-zero amplification circuits. In this regard, practical prior art auto-zero amplifier circuits have generally been limited to a dynamic range of +2 volts or less. Obviously, it would be desirable to increase the dynamic range of auto-zero amplifier circuits and overcome the foregoing disadvantages without unduly increasing the complexity or cost of such circuits.

Therefore, it is an object of this invention to provide a new and improved auto-zero amplifier circuit.

It is also an object of this invention to provide a new and improved auto-zero amplifier circuit having a wide dynamic range.

It is another object of this invention to provide a new and improved auto-zero amplifier circuit having very little offset voltage error, low gain error and low noise in its output signal.

It is still another object of this invention to provide a new and improved auto-zero amplifier circuit wherein voltage swings between the auto-zero mode of operation and the accurate amplification mode of operation are relatively small.

SUMMARY OF THE INVENTION

In accordance with this invention an auto-zero amplifier circuit having a wide dynamic range is provided. The wide dynamic range is achieved by referencing the auto-zero capacitor of the auto-zero amplifier circuit to the input signal, rather than a fixed voltage level (e.g., ground) during the auto-zero mode of operation.

The preferred embodiment of the invention includes an operational amplifier that is continuously switched back-and-forth between an auto-zero mode of operation and an accurate amplification mode of operation. During the auto-zero mode of operation, the junction between an auto-zero capacitor and the noninverting input of the operational amplifier is referenced to the input signal voltage via a bootstrap amplifier. Further, the other end of the auto-zero capacitor is referenced to the output of the operational amplifier, which is also connected to the inverting input of the operational amplifier. As a result, the auto-zero capacitor is charged to a voltage level equal to the input offset voltage of the operational amplifier. During the accurate amplification mode of operation, the input signal is applied through the auto-zero capacitor to the noninverting input of the operational amplifier. Since the voltage charge on the auto-zero capacitor is equal in magnitude, but opposite in sign, to the input offset voltage of the operational amplifier, the input offset voltage of the operational amplifier is cancelled during the accurate amplification mode of operation, whereby the output voltage is equal to the input voltage times the gain of the operational amplifier. Preferably, in addition to the operational amplifier, the bootstrap amplifier and the auto-zero capacitor, the auto-zero amplifier circuit includes three solid state switches—one solid state switch is connected between the output of said bootstrap amplifier and the junction between the auto-zero capacitor and the noninverting input of the operational amplifier; the second solid state switch is connected between the output of the operational amplifier and the other end of the auto-zero capacitor; and, the third solid state switch is connected between the input signal terminal and the other end of the auto-zero capacitor. When the first and second switches are closed and the third switch is open, the auto-zero amplification circuit is in its auto-zero mode of operation. Contrariwise, when the first and second solid state switches are open and the third solid state switch is closed, the circuit is in its accurate amplification mode of operation. While the solid state switches can take the forms of transistor, junction field effect transistor (JFET), depletion type metal oxide semiconductor field effect transistor (MOSFET) or photoresistor switches, the preferred type of switch is the N-channel enhancement type MOSFET because of their low charge injection characteristics. Also, if desired, mechanical or electromechanical switches can be used.

In the preferred form of the invention, the enhancement type N-channel MOSFETs are controlled by an underlap timer and drive circuit. The underlap timer and drive circuit includes an underlap timing circuit that receives a rectangular wave and, in accordance therewith, produces a pair of rectangular control signals that control the first, second and third switches such that the on state of the first and second switches on the one hand and the third switch on the other hand never overlap. The resultant underlap period is set such that it does not create glitches (e.g., pulses) during the operation of an auto-zero amplifier circuit formed in accordance with the invention.

It will be appreciated from the foregoing summary that the invention has all the advantages of prior art auto-zero amplifier circuits, yet functions over a substantially wider dynamic range. Specifically, the invention greatly reduces amplifier input offset voltage drift due to time, temperature and low frequency noise. Further, the auto-zero amplifier circuit of the invention substantially eliminates amplifier input offset voltage errors due to power supply rejection ratio (PSRR) and common mode rejection ratio (CMRR). Moreover, contrary to prior art auto-zero amplifier circuits, high amplifier bandwidth and slew rate are not required. Errors due to finite amplifier loop gain are also greatly reduced. In addition, auto-zero amplifier circuits formed in accordance with the invention can use very low breakdown voltage switches to minimize charge injection. More specifically, low breakdown voltage switches have low interelectrode capacitance, whereby charge injection is minimized. Further, if high voltage amplifiers are used, amplification of voltages well above the voltage limits of typical switches can be achieved. Finally, the invention achieves the foregoing advantages with a relatively inexpensive modification to prior art type auto-zero amplifier circuits.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Prior to describing the preferred embodiment of the invention a description of a common type of prior art auto-zero amplifier circuit is described for comparison purposes. Such a circuit is illustrated in FIG. 1.

Figure 1:
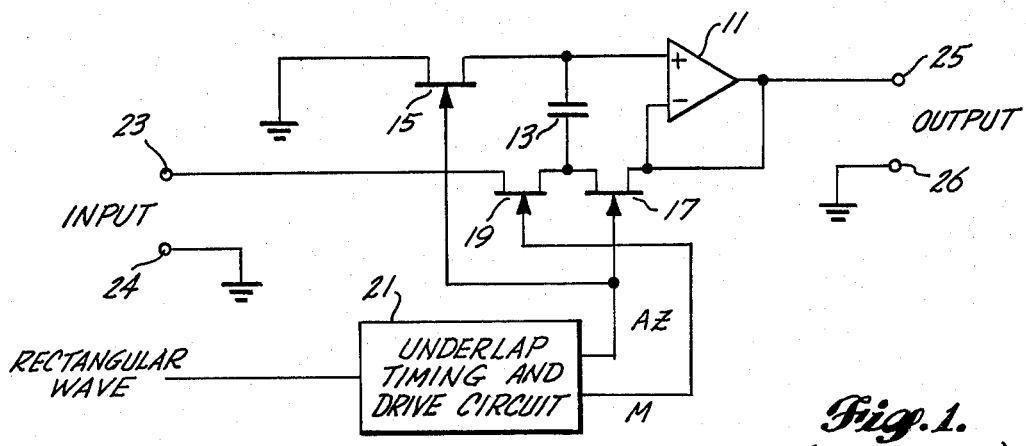
FIG. 1 is a schematic diagram of a prior art auto-zero amplifier circuit.

The prior art auto-zero amplifier circuit illustrated in FIG. 1 comprises: an operational amplifier 11; an auto-zero capacitor 13; three N-channel junction field affect transistor (JFET) switches 15, 17 and 19; and, an underlap timing and drive circuit 21. The underlap timing and drive circuit is controlled by a single rectangular signal and produces a pair of rectangular signals. The pair of rectangular signals control the on/off state of JFET switches 15, 17 and 19 and are formed such that when one of the pair of rectangular singals commands that its associated switch be turned on the other rectangular signal commands its associated switch(es) to be off and vice-versa. Further, the on commands are formed such that no overlap occurs. Rather a slight time delay elapses between the time one output commands an off state and the other output commands an on state.

An input signal is received at a pair of input terminals 23 and 24, one of which is connected to ground. The other terminal 23 is connected to the source terminal of the third JFET 19. The drain terminal of the third JFET is connected to one side of the auto-zero capacitor 13 and to the drain terminal of the second JFET 17. The source terminal of the second JFET 17 is connected to the output of the operational amplifier 11 and to the inverting input of the operational amplifier 11. The drain terminal of the first JFET 15 is connected to ground and the source terminal of the first JFET 15 is connected to the other side of the auto-zero capacitor 13 and to the noninverting input of the operational amplifier 11. The output of the operational amplifier 11 is also connected to one output terminal 25 of a pair of output terminals. The other output terminal 26 is connected to ground. Finally, one output of the underlap timing and drive circuit 21 is connected to the gate terminals of the first and second JFETs 15 and 17. The output is denoted the auto-zero (AZ) output because it enables the first and second JFETs when the auto-zero amplifier circuit is to be placed in its auto-zero mode of operation. Correspondingly, the other output of the underlap timing and drive circuit 21 is connected to the gate of the third JFET 19. The other output is denoted the measuring (M) output because it enables the third JFET when the auto-zero amplifier circuit is to be placed in its accurate amplification mode of operation. As noted above, except for the underlap delay, the M output is the complement of the AZ output. As a result, ignoring the underlap delay, the third JFET is always in the opposite state to the state of the first and second JFETs.

In operation, the auto-zero amplifier circuit illustrated in FIG. 1 alternates between an auto-zero mode of operation and an accurate amplification mode of operation. When in the auto-zero mode of operation, the first and second JFETs 15 and 17 are closed (signal passing state) and the third JFET 19 is open (signal inhibiting state). As a result, the junction between the auto-zero capacitor 13 and the noninverting input of the operational amplifier 11 is connected to ground (via the first JFET 15). In addition, the output of the operational amplifier 11 is connected to the other end of the auto-zero capacitor 13 (via the second JFET 17). Consequently, the auto-zero capacitor 13 charges to a voltage level equal to the offset input voltage of the operational amplifier 11. The auto-zero amplifier circuit remains in this auto-zero mode of operation for a time period adequate for the voltages to stabilize, i.e., the output of the operational amplifier 11 to reach ground potential, and the auto-zero capacitor 13 to fully charge.

When the auto-zero amplifier circuit illustrated in FIG. 1 is in its accurate amplification mode of operation, the first and second JFETs 15 and 17 are open and the third JFET 19 is closed. Consequently, the input signal is applied through the auto-zero capacitor 13 to the noninverting input of the operational amplifier 11. As a result, the auto-zero voltage charge cancels the offset input voltage of the operational amplifier 11, whereby the voltage across the output terminals is equal to the input voltage times the gain of the operational amplifier, which, in the illustrated case, is one (1), since no feedback gain resistors are included. Obviously, gain can be provided using well-known feedback resistive networks connected in circuit with the operational amplifier—see FIG. 7, described below.

Figure 2:
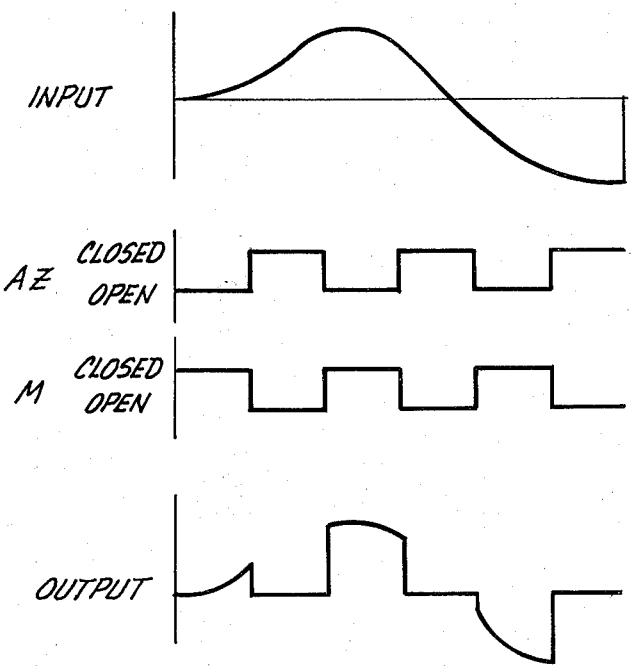
FIG. 2 is a series of waveform diagrams used to assist in the understanding of the description of the prior art auto-zero amplifier circuit illustrated in FIG. 1.

It will be appreciated from the foregoing description and viewing FIG. 1 that the voltage at the output of the operational amplifier 11 of the auto-zero amplifier circuit illustrated in FIG. 1 swings between the value of the input voltage and ground. More specifically, as illustrated in FIG. 2, for an input voltage waveform of the type illustrated on the first line, if the AZ and M signals have 50% duty cycles, the output signal will be chopped, as illustrated in the fourth line. As can be readily seen, the output voltage swings between zero and positive and negative voltage levels. These wide voltage swings limit the dynamic range of practical prior art auto-zero amplifier circuits of the type illustrated in FIG. 1 to +2 volts or less. If this limitation is not met, spikes and noise proportional to the common-mode swing of the output voltage will cause unacceptable offset voltage errors, gain errors and noise in the output signal. Further, amplifier errors due to inadequate signal common-mode rejection will occur. Still further, the signal voltage drop across the JFET switches may become higher than the voltage ratings of such devices. Moreover, settling time is longer than desirable. The invention is directed to overcoming these disadvantages of prior art auto-zero amplifier circuits.

Figure 3:
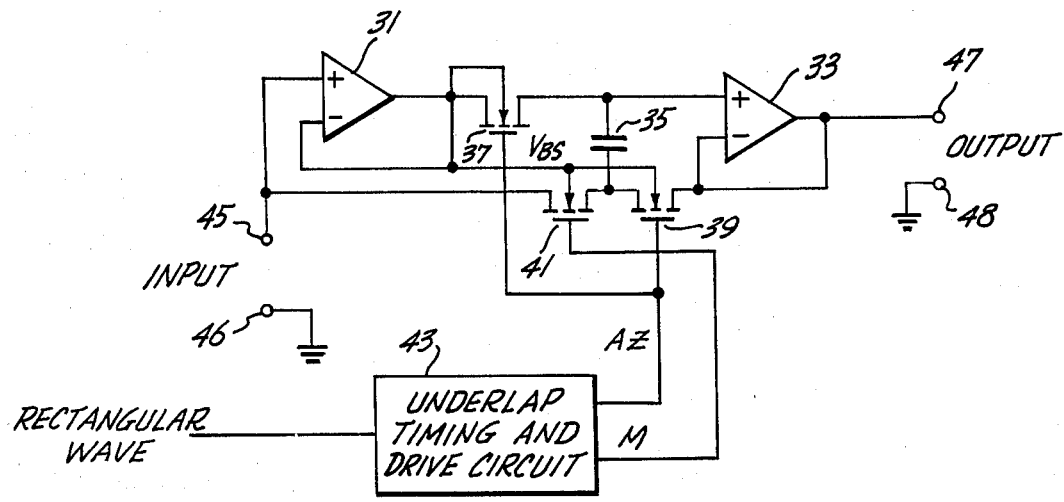
FIG. 3 is a schematic diagram of a preferred embodiment of the invention.

FIG. 3 is a schematic diagram of a preferred embodiment of an auto-zero amplifier circuit formed in accordance with the invention. The auto-zero amplifier circuit illustrated in FIG. 3 includes first and second operational amplifiers 31 and 33; an auto-zero capacitor 35; first, second and third N-channel enhancement type metal oxide semiconductor field effect transistor (MOSFET) switches 37, 39 and 41; and, an underlap timing and drive circuit 43. As hereinafter described in more detail with respect to FIGS. 8 and 9, the underlap timing and drive circuit 43 produces a pair of MOSFET control signals denoted AZ and M, which are complementary, except for an underlap delay.

The input signal is applied across a pair of input terminals 45 and 46, one of which is connected to ground. The other input terminal 45 is connected to the noninverting input to the first or bootstrap operational amplifier 31. The output of the first operational amplifier 31 is connected to the inverting input of the first operational amplifier and to the source terminal of the first MOSFET 37. The drain terminal of the first MOSFET 37 is connected to one side of the auto-zero capacitor 35 and to the noninverting input of the second operational amplifier 33. The input terminal 45 is also connected to the drain terminal of the third MOSFET 41. The source terminal of the third MOSFET 41 is connected to the other side of the auto-zero capacitor 35 and to the drain terminal of the second MOSFET 39. The source terminal of the second MOSFET 39 is connected to the inverting input of the second operational amplifier 33 and to the output of the second operational amplifier 33. The output of the second operational amplifier 33 is also connected to one of a pair of output terminals 47 and 48, the other one of which is connected to ground.

The AZ output of the underlap timing and drive circuit 43 is connected to the gate of the first and second MOSFETs 37 and 39. The M output of the underlap timing and drive circuit 43 is connected to the gate of the third MOSFET 41. Finally, the output of the first operational or bootstrap amplifier is connected to the body terminals of the first, second and third MOSFETs 37, 39 and 41. This output forms a bootstrap signal, $V_{BS}$, which acts as a reference voltage for driving the MOSFET switches.

Figure 4:
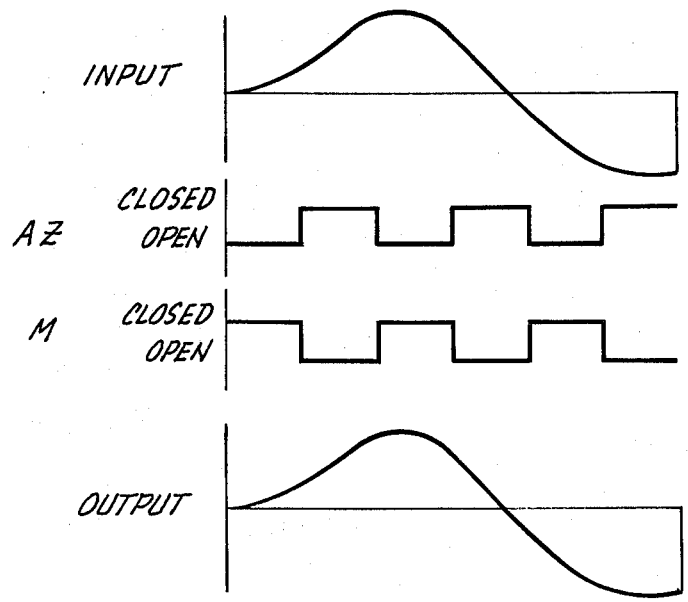
FIG. 4 is a series of waveform diagrams used to assist in the understanding of the embodiment of the invention illustrated in FIG. 3.

As will be appreciated from viewing FIG. 3 and the foregoing description, the auto-zero amplifier circuit illustrated in FIG. 3 is similar to the auto-zero amplifier circuit illustrated in FIG. 1 except that the switches are N-channel enhancement MOSFETs rather than JFETs and the source terminal of the first MOSFET 37 is connected to the signal input terminal 45 via the first (bootstrap) operational amplifier 31, rather than being connected to ground. Consequently, the junction between the auto-zero capacitor 35 and the noninverting input of the second operational amplifier 33 is connected to receive the input signal during the auto-zero mode of operation, rather than being connected to ground. As a result, the output of the second operational amplifier 33 does not swing between ground and the input signal voltage (see FIG. 4, line 4), as does the output of the operational amplifier 11 illustrated in FIG. 1. Rather, the output voltage only swings by the amount of the offset voltages of the first and second operational amplifiers. This value is too small to show up on line 4 of FIG. 4 since it is in the millivolt range, assuming that the input voltage is in the volt range or above. Yet, as with the auto-zero amplifier circuit illustrated in FIG. 1, the auto-zero capacitor 35 charges up to the level of the input offset voltage of the second operational amplifier 33 during the auto-zero mode of operation. Further, the polarity of the auto-zero capacitor charge is still such that it cancels the polarity of the input offset voltage of the second operational amplifier 33 during the amplification mode of operation.

Figure 5:
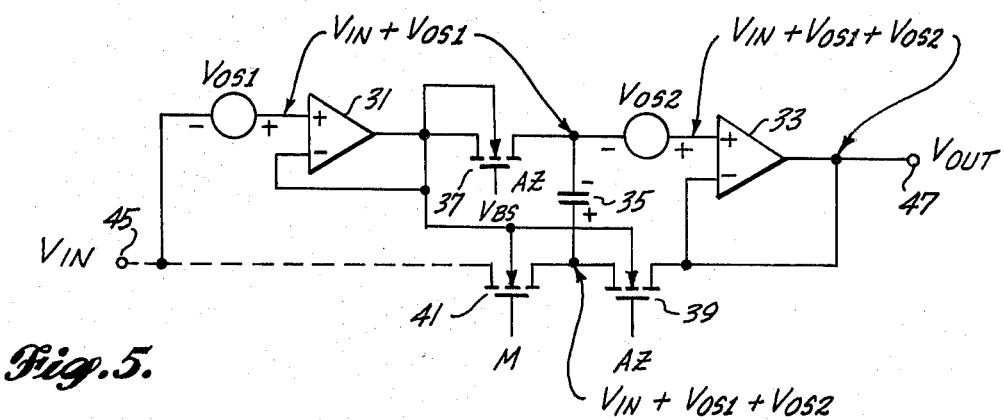
FIG. 5 is a schematic diagram illustrating the signal flow path through the embodiment of the invention illustrated in FIG. 3 when it is in its auto-zero mode of operation.

FIG. 5 illustrates the signal path through the auto-zero amplifier circuit illustrated in FIG. 3 when it is in its auto-zero mode of operation. More specifically, the auto-zero mode signal flow path is illustrated by solid lines, inactive paths being illustrated by dashed lines. Since the third MOSFET is open, no current flows between the input terminal 45 and the side of the auto-zero capacitor connected to the junction between the second and third MOSFETs 39 and 41. Rather the input signal is applied to the first operational amplifier 31.

As illustrated in FIG. 5 the voltage at the noninverting input of the first operational amplifier 31 can be represented by $V_{IN}+V_{OS1}$ where $V_{IN}$ represents the input voltage and $V_{OS1}$ represents the input offset voltage of the first operational amplifier 31. Since the first operational amplifier 31 is connected as a noninverting amplifier, and the voltage drop across the first MOSFET 37 is substantially zero, the voltage at the junction between the auto-zero capacitor 35 and the drain terminal of the first MOSFET 37 is also $V_{IN}+V_{OS1}$. The voltage at the noninverting input terminal of the second operational amplifier 33 is this voltage plus the input offset voltage of the second operational amplifier. Thus, the voltage at the noninverting input terminal of the second operational amplifier 33 is $V_{IN}+V_{OS1}+V_{OS2}$. Since the second operational amplifier 33 is also connected in a noninverting manner, the output of the second operational amplifier is also $V_{IN}+V_{OS1}+V_{OS2}$. This voltage is applied to the other side of the auto-zero capacitor, i.e., the junction between the auto-zero capacitor 35 and the drain terminal of the second MOSFET 39. Consequently, the voltage drop across the auto-zero capacitor 35 is equal to the offset voltage of the second operational amplifier i.e., $V_{OS2}$. More specifically, the voltage across the auto-zero capacitor 35 is equal to the difference between the voltages at its two terminals. Since one of these voltages is equal to $V_{IN}+V_{OS1}$ and the other voltage is equal to $V_{IN}+V_{OS1}+V_{OS2}$, the magnitude of the voltage drop across the auto-zero capacitor is equal to $V_{OS2}$.

Figure 6:
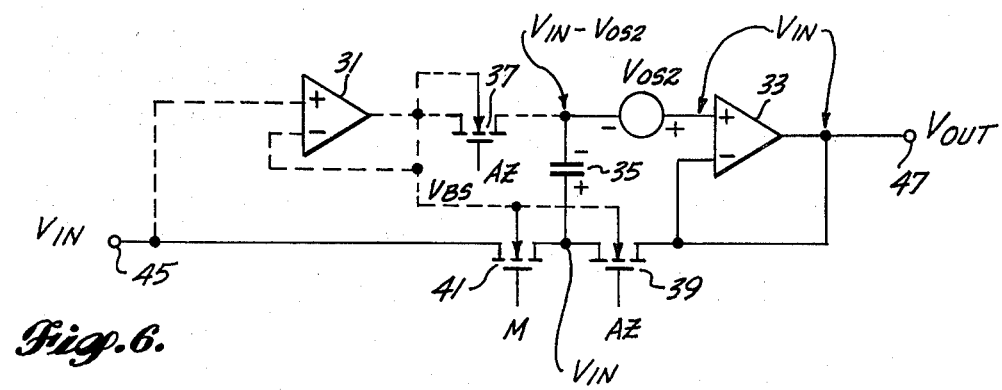
FIG. 6 is a schematic diagram illustrating the signal flow path through the embodiment of the invention illustrated in FIG. 3 when it is in its accurate amplification mode of operation.

FIG. 6 illustrates the signal flow path through the auto-zero amplifier circuit illustrated in FIG. 3 when it is in its accurate amplification mode of operation. As with FIG. 5, the signal flow path is illustrated by the solid lines. Inactive paths are illustrated by the dashed lines. In the accurate amplification mode of operation, the first and second MOSFETs 37 and 39 are open and the third MOSFET 41 is closed. As a result, no signal connection exists between the output of the second operational amplifier 33 and the other side of the auto-zero capacitor 35. Rather, the auto-zero capacitor 35 is connected to couple the input signal to the noninverting input of the second operational amplifier 33. Because the auto-zero capacitor 35 carries a charge equal, but opposite in sign, to the offset input voltage ($V_{OS2}$) of the second operational amplifier, the auto-zero capacitor charge cancels the input offset voltage, $V_{OS2}$, of the second operational amplifier 33. More specifically, the voltage at the input terminal side of the auto-zero capacitor 35 is, of course, equal to $V_{IN}$. The voltage at the other terminal of the auto-zero capacitor 35 is equal to $V_{IN}-V_{OS2}$. Consequently, the voltage at the noninverting input terminal, after adding the input offset voltage of the second operational amplifier, $V_{OS2}$, is equal to $V_{IN}$, whereby the voltage at the output of the second operational amplifier 33 is also equal to $V_{IN}$. Consequently, the output voltage is an accurate representation of the input voltage. Since the second operational amplifier of the illustrated auto-zero amplifier circuit has a gain of one (1), the output voltage is exactly equal to the input voltage. In this regard, if desired, and as illustrated in FIG. 7 and hereinafter described, the gain of the second operational amplifier may be controlled by a suitable feedback resistor network.

As will be readily appreciated from the foregoing description and viewing FIGS. 5 and 6, in particular, the voltage swings at the output of the second operational amplifier and other points in the auto-zero amplifier circuit illustrated in FIG. 3 lie between $V_{IN}$ and $V_{IN}+V_{OS1}+V_{OS2}$. In other words, the maximum voltage swing between the auto zero and the accurate amplification modes of operation is equal to $V_{OS1}+V_{OS2}$, which voltage is very small, usually in the millivolt range. Since the voltage swings determine the maximum voltage drop across the MOSFETs, inexpensive low voltage MOSFEts (or other low voltage solid state switching devices) can be used. Yet, the dynamic range of an auto-zero amplifier circuit of the type illustrated in FIG. 3 is substantially greater than the dynamic range of an auto-zero amplifier circuit of the type illustrated in FIG. 1. More specifically, as previously discussed, a typical practical auto-zero amplifier circuit of the type illustrated in FIG. 1 has a dynamic range of ±2 volts, or less. Contrariwise, one actual embodiment of the invention illustrated in FIG. 3 has a dynamic range in excess of ±16.5 volts. Moreover, the amount of noise and errors present over this range is substantially less than the amount of noise and errors present over the dynamic range of a typical auto-zero amplifier circuit of the type illustrated in FIG. 1.

In summary, an auto-zero amplifier circuit formed in accordance with the invention has the advantages of prior art auto-zero amplifier circuits of the type illustrated in FIG. 1 in that errors caused by amplifier input offset voltage drift due to time, temperature and low frequency noise are substantially eliminated. In addition, an auto-zero amplifier circuit formed in accordance with the invention has a number of additional advantages. For example, amplifier input offset voltage errors due to power supply rejection ratio (PSRR) and common mode rejection ratio (CMRR) are eliminated. Further, high amplifier bandwidth and slew rate are not required. In addition, errors due to finite amplifier loop gain are greatly reduced. Also, because of the low voltage present across the various switches, very low voltage MOSFETs or other solid state switches with low interelectrode capacitance can be utilized, whereby charge injection is minimized. In this regard, even though the input voltage and, thus, the amplifier voltage levels are relatively high, switch voltage drops remain relatively low. Thus, amplification voltages well above the limits of typical switches can occur in an actual embodiment of the invention without the switches being destroyed. Moreover, the foregoing advantages are achieved with the use of readily available (e.g., off-the-shelf) inexpensive components.

Figure 7:
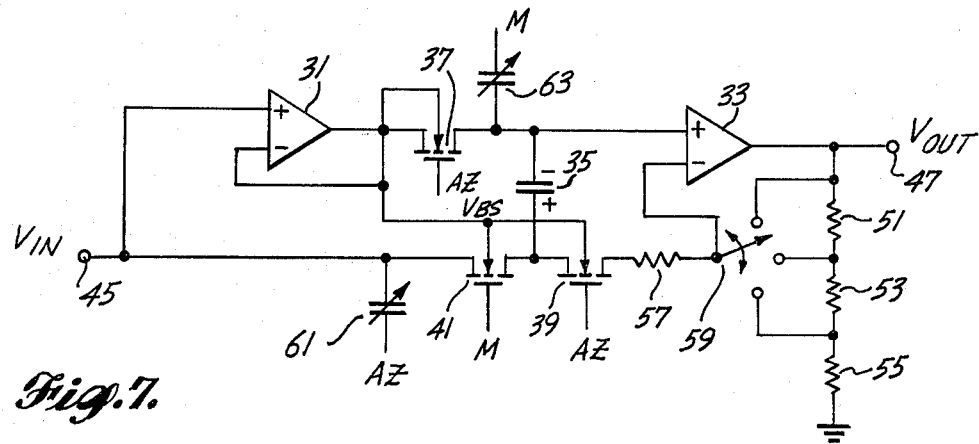
FIG. 7 is a schematic diagram of a modified version of the embodiment of the invention illustrated in FIG. 3.

FIG. 7 is a schematic diagram of a modification of the preferred embodiment of the invention, which includes the foregoing advantages, plus amplifier gain and substantially zero residual offset voltages. More specifically, in addition to the elements illustrated in FIG. 3 and previously described, the embodiment of the invention illustrated in FIG. 7 also includes four resistors 51, 53, 55 and 57; a single pole, triple throw switch 59 (which, preferably is actually formed of FET switches); and, two variable capacitors 61 and 63. As with the embodiment of the invention illustrated in FIG. 3, the input terminal 45 is connected to the noninverting input of the first operational amplifier 31. The output of the first operational amplifier 31 is connected to its inverting input and to the source terminal of the first MOSFET 37. The drain terminal of the first MOSFET 37 is connected to one side of the auto-zero capacitor 35 and to the noninverting input of the second operational amplifier 33. The output of the second operational amplifier 33 is connected to the output terminal 47 and through three of the resistors 51,53 and 55 connected in series to ground. The output of the second operational amplifier 33 is also connected to one remote terminal of the single pole, triple throw switch 59. Another remote terminal of the single pole, triple throw switch 59 is connected to the junction between the first and second resistors 51 and 53. The third remote terminal of the single pole, triple throw switch 59 is connected to the junction between the second and third resistors 53 and 55. The common terminal of the single pole, triple throw switch 59 is also connected to the inverting input of the second operational amplifier 33 and through the fourth resistor 57 to the source terminal of the second MOSFET 39. The drain terminal of the second MOSFET 39 is connected to the source terminal of the third MOSFET 41 and to the other terminal of the auto-zero capacitor 35. The drain terminal of the third MOSFET 41 is connected to the input terminal 45. Further, the input terminal is connected through the first variable capacitor 61 to the AZ output of the underlap timing and drive circuit 43. And, the junction between the drain terminal of the first MOSFET 37 and the auto-zero capacitor 35 is connected through the second variable capacitor 63 to the M output of the underlap timing and drive circuit. Finally, the output of the first operational amplifier, $V_{BS}$, is connected to the body of the MOSFET switches 37, 39 and 41.

As will be readily appreciated by those skilled in the electronics art, the first three resistors 51, 53 and 55 form an adjustable ratio voltage divider that controls gain of the second operational amplifier 33. For example, the gain can be set equal to 1, 8 or 64 (or any other value), as desired. The fourth resistor is included to provide any necessary loop gain stability during the auto-zero mode of operation. The variable capacitors 61 and 63 are adjusted to eliminate small, residual offset voltages caused by charge injections resulting from switching control signals M and AZ through the interelectrode capacitances of the MOSFETs and through printed circuit board layout stray capcitances onto the auto-zero capacitor 35, or onto input filter capacitors (not shown).

Not only is $V_{BS}$ extremely useful as a reference voltage for driving the switching of the MOSFETs (and any switch control means utilized to change the gain of the feedback path of the second operational amplifier 33), $V_{BS}$ can be utilized to assist in producing the MOSFET drive signals AZ and M in the timing and drive circuit 43.

Figure 8:
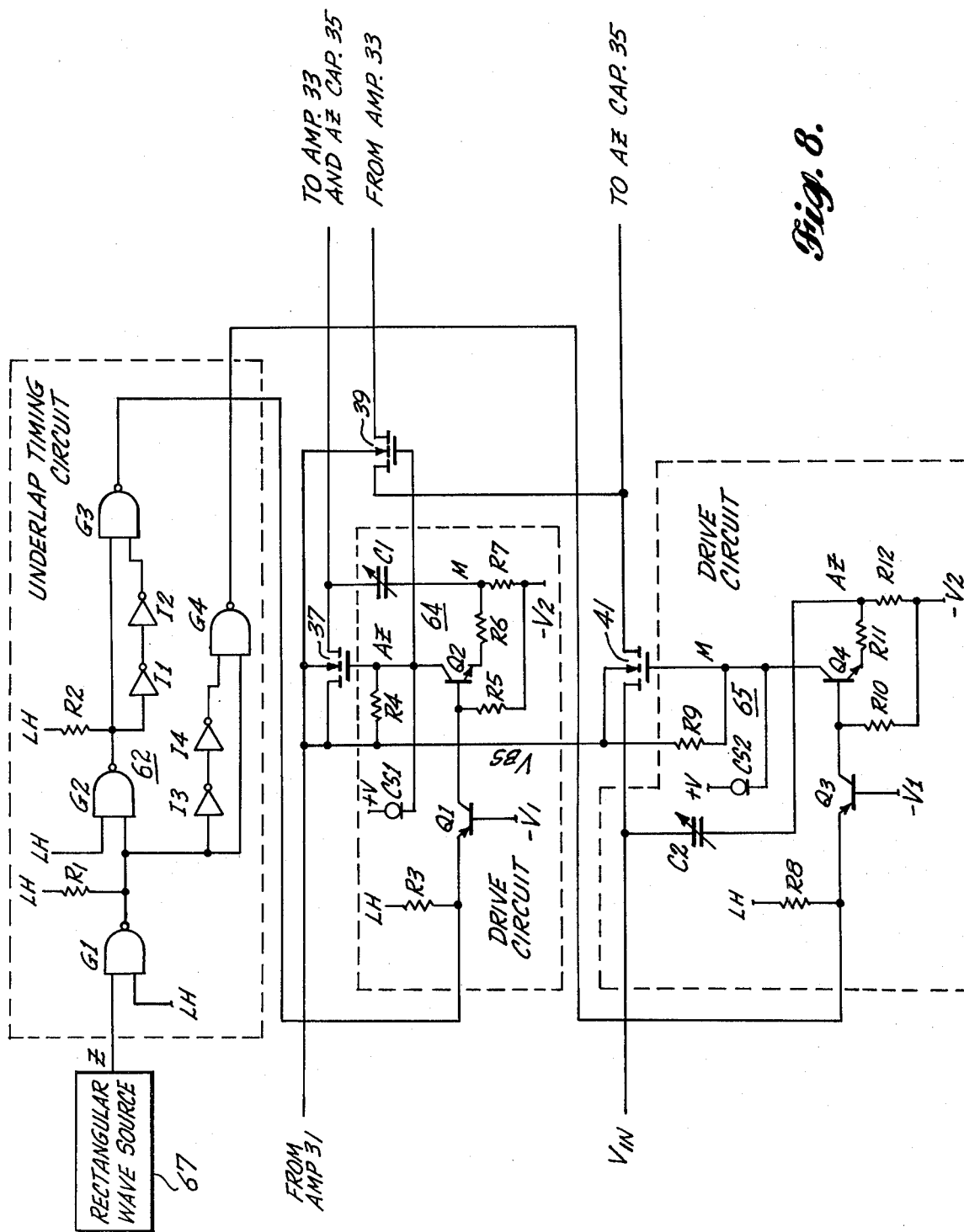
FIG. 8 is a schematic diagram of an underlap timing and drive circuit suitable for use in the preferred embodiments of the invention illustrated in the drawings; and, FIG. 9 is a timing diagram illustrating the operation of the underlap timing portion of the underlap timing and drive circuit illustrated in FIG. 8.

FIG. 8 is a schematic diagram of an underlap timing and drive circuit suitable for use in the preferred embodiments of the invention and comprises: an underlap timing circuit 62; and, first and second drive circuits 64 and 65. The underlap timing circuit comprises: four two-input NAND gates designated G1, G2, G3 and G4; four inverters designated I1, I2, I3 and I4; and, two resistors designated R1 and R2. The output of a rectangular wave source 67, denoted Z, is applied to one input of G1. The rectangular wave can have any suitable duty cycle. In this regard, in one actual embodiment of the invention, the chosen rectangular wave (Z) had a 40/60 duty cycle. Specifically, the wave was low for 1.6 milliseconds and high for 2.4 milliseconds.

The other input of G1 is connected to logic high (LH), whereby G1 functions as an inverter. The output of G1 is connected through R1 to LH, to one input of G2, to the input of I3 and to one input of G4. The other input of G2 is also connected to LH. The output of G2 is connected through R2 to LH and to one input of G3. The output of G2 is also connected through I1 in series with I2 to the other input of G3. The output of G3 is connected to the control input of the first drive circuit 64. The output of I3 is connected to the input of I4 and the output of I4 is connected to the second input of G4. The output of G4 is connected to the control input of the second drive circuit 65.

The underlap timing circuit 62 provides two generally complementary control signals having a rectangular shape, based on the single rectangular wave input. The control signals are such that, while generally complementary, the signal in a particular state (ON) always switches to the other state (OFF) before the other signal switches from the other state (OFF) to the first state (ON). In the illustrated circuit, the particular or underlap state is the low state since this controls the switching on of the MOSFETs. Thus, when one of the outputs of the underlap timing circuit switches from the high state (OFF) to the low state (ON), it does so after the other signal switches from the low state (ON) to the high state (OFF). This action occurs regardless of which output switches from the high state to the low state. As a result, the MOSFETs are never all on at the same time. Rather, either the first and second MOSFETs 37 and 39 are on and the third MOSFET 41 is off or the third MOSFET is on and the first and second MOSFETs are off. During the underlap delay period, of course, all of the MOSFETs are off. In order for this mode of operation to be better understood, attention is directed to FIG. 9.

Figure 9:
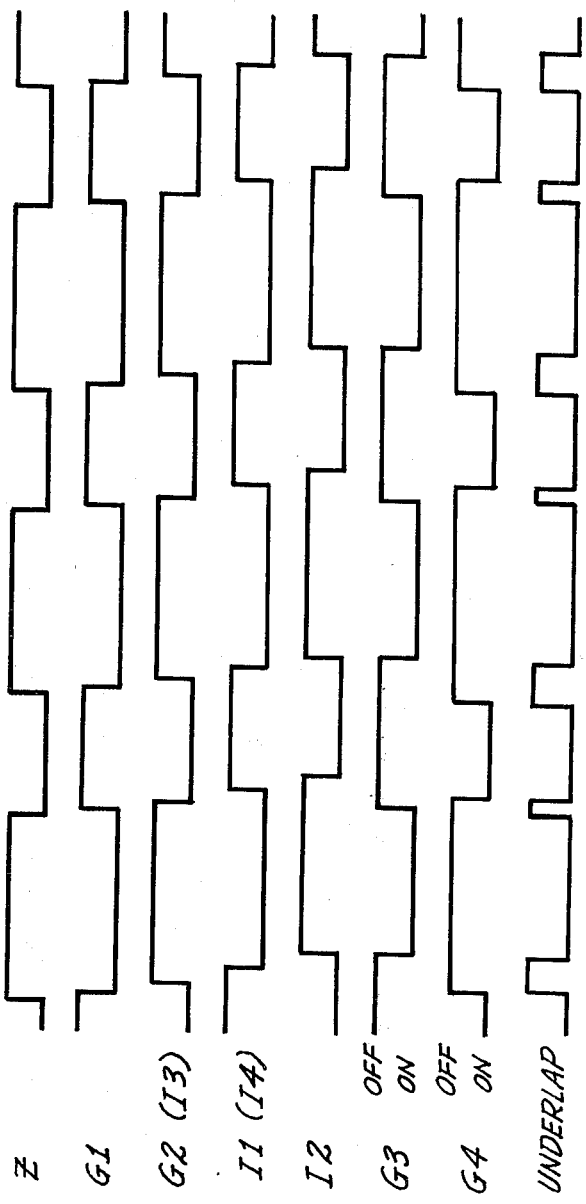

The first line of FIG. 9 illustrates the Z signal produced by the rectangular wave source 67. The illustrated waveform is high for 60% of an overall duty cycle and low for 40%. The second line of FIG. 9 illustrates the output of G1. As noted above, G1 forms an inverter. Thus, the output of G1 has the inverted shape of Z, delayed by the time delay created by G1. Similarly, G2 functions as an inverter. As a result, G2 has the same wave shape as Z, but delayed therefrom by an amount equal to the time delay created by G1 and G2. The output of I1 is the inverted output of G1, delayed by the amount of the delay of I1 and the output of I2 is the inverted output of I1 delayed by the value of I2. Thus, the output of I2 is the same as the output of G2, delayed by two additional delayed periods. G3 combines the outputs of G2 and I2 to form a signal of the type illustrated on line G3 of FIG. 9.

The output of I3 is the same as the output of G2 and in phase therewith if the G2 and I3 delays are the same. Further, the output of I4 is the same as the output of I1 and in phase therewith if the delay created by I1 is equal to the delay created by I4. In such a case, the output of G4 is shown on the related line of FIG. 9. (If the G2/I3 and/or the I1/I4 delays are unequal the illustrated G4 output will have the same shape, but be shifted to the right or left by the difference).

It will be noted from viewing FIG. 9 that the output of G3 shifts from a low state to a high state prior to the output of G4 shifting from a high state to a low state. Moreover, the output of G4 shifts from a low state to a high state prior to the output of G3 shifting from a high state to a low state. Consequently, there is a time delay, herein defined as an underlap, that occurs between the time when one of the signals shifts from a low state to a high state before the other output shifts from a high state to a low state. These underlap periods are illustrated on the last line of FIG. 9. In general, two delay periods exist between the time the output of G4 shifts from a low state to a high state and the output of G3 shifts from a high state to a low state and a single delay period exists between the time the output of G3 shifts from a low state to a high state and the output of G4 shifts from a high state to a low state. Preferably, these underlap time periods fall in the 10–50 nanosecond range. if the delay is kept within this range, undesirable circuit glitches (e.g., pulses) are not created in the auto-zero amplifier circuit when the high-low shifts cause the MOSFETs to be switched on and the low-high shifts cause the MOSFETs to be switched off, as hereinafter described.

The first drive circuit 64 comprises: five resistors designated R3, R4, R5, R6 and R7; a semiconductor connected to form a constant current diode designated CS1; a PNP transistor designated Q1; an NPN transistor designate Q2; and, a variable capacitor designated C1. The output of G3 is connected to the emitter of Q1, which is also connected through R3 to logic high (LH). The base of Q1 is connected to a first voltage source designated −V1, which is negative with respect to LH. The collector of Q1 is connected to the base of Q2. The base of Q2 is also connected through R5 to a second voltage source designated −V2, which is negative with respect to −V1. −V2 is also connected by R6 in series with R7 to the emitter of Q2. The collector of Q2 is connected via CS1 to a third voltage source designated +V, which is positive with respect to LH, −V1 and −V2. The collector of Q2 is also connected to the gate of the first and second MOSFETs 37 and 39, and through R4 to the source terminal of the first MOSFET 37. Finally, the junction between R6 and R7 is connected through C1 to the drain terminal of the first MOSFET 37.

When the output of G3 is high, Q1 and Q2 are biased on, whereby the gates of the first and second MOSFETs 37 and 39 are low. As a result, in this condition, the first and second MOSFETs are off. When the output of G3 shifts from high to low, Q1 is turned off. As a result, Q2 is turned off. Consequently, the voltage on the gates of the first and second MOSFETs 37 and 39 rises, whereby these MOSFETs turn on.

C1 (which is the same as the second capacitor 63 in FIG. 7) is included to provide an offset adjustment for slowly varying DC signals. In this regard, since C1 is connected to the junction between R6 and R7 it is coupled to the complement of the signal on the collector of Q2, which is the AZ control signal illustrated in FIGS. 3 and 5–7, previously described. Since the R6/R7 junction signal is the complement of the AZ signal, it is similar to M, without the underlap delay. The R6/R7 junction signal is used rather than the corresponding M drive signal produced by the hereinafter described second drive circuit to avoid the underlap delay inherent in the M drive signal produced by the second drive circuit, because the underlap delay is undesirable for the zero adjust circuits. In this way, new spikes are avoided and any existing spikes are reduced.

The second drive circuit 65 is substantially the same as the first drive circuit 63 and comprises: five resistors designated R8, R9, R10, R11 and R12; a constant current diode designated CS2; a PNP transistor designated Q3; an NPN transistor designated Q4; and, a variable capacitor designated C2. The output of G4 is connected through R8 to LH and to the emitter of Q3. The base of Q3 is connected to −V1 and the collector of Q3 is connected to the base of Q4. The base of Q4 is also connected through R10 to −V2. The emitter of Q4 is connected through R11 in series with R12 to −V2. The collector of Q4 is connected to +V via CS2 and to the base of the third MOSFET 41. In addition, R9 is connected between the body and the base of the third MOSFET 41. As with the first drive circuits 64, when the output of G4 shifts from high to low, Q3 is turned off. As a result, Q4 is turned off. Consequently, the third MOSFET 41 is turned on.

C2 is connected between the drain of the third MOSFET 41 and the junction between R11 and R12. C2 corresponds to the first capacitor 61 in FIG. 7. As with C1, C2 is connected to the R11/R12 junction, which is the complement of the signal on the collector of Q4 and thus is the same as AZ in order to avoid the underlap delay inherent in the AZ control signal produced at the output of Q2. C2 provides an offset adjustment for fast DC signals.

While preferred embodiments of the invention have been illustrated and described, it will be appreciated that various changes can be made therein without departing from the spirit and scope of the invention. For example, solid state switches other than MOSFETs and JFETs, such as transistor switches and photo resistor switches can be utilized, if desired. Of course, the use of such switches may result in embodiments of the invention having substantially greater change injection. Also, in some instances, mechanical or electromechanical switches can be used. Hence, the invention can be practiced otherwise than as specifically described herein.

The embodiments of the invention in which an exclusive property or privilege is claimed are defined as follows:

1. In an auto-zero amplifier circuit wherein an operational amplifier is switched between an auto-zero mode of operation during which the value of the input offset voltage of the operational amplifier is determined and stored on a capacitor and an accurate amplification mode of operation during which the stored value of the input offset voltage is summed with an input signal to compensate for the input offset voltage of the operational amplifier, the improvement comprising:
first circuit means for applying the input signal to a common junction between the input of the operational amplifier and one side of the capacitor during the auto-zero mode of operation and second circuit means for applying the output of the operational amplifier to the other side of the capacitor during the auto-zero mode of operation, said first and second circuit means further connecting said capacitor in shunt with the input of the operational amplifier during the auto-zero mode of operation and in series with the input signal during the accurate amplification mode of operation.

2. The improvement claimed in claim 1 wherein said first circuit means includes a further operational amplifier connected to apply the input signal to the common junction between the capacitor and the input of said operational amplifier during said auto-zero mode of operation.

3. An auto-zero amplifier circuit including:
an operational amplifier;
a two terminal voltage storage means;
first switch means for connecting one terminal of said storage means to an input terminal adapted to receive input signals, said same terminal of said storage means being connected to one input of said operational amplifier;
second switch means for connecting the other terminal of said storage means to the other input of said operational amplifier; and,
third switch means for connecting said other terminal of said storage means to said input terminal.

4. An auto-zero amplifier circuit as claimed in claim 3 including a second operational amplifier connected between said input terminal and said first switch means.

5. An auto-zero amplifier circuit as claimed in claim 4 wherein said storage means is a capacitor.

6. An auto-zero amplifier circuit as claimed in claim 5 wherein said first operational amplifier has an inverting terminal and a noninverting terminal and wherein said one terminal of said capacitor is connected to said noninverting terminal of said operational amplifier.

7. An auto-zero amplifier circuit as claimed in claim 6 wherein said first, second and third switch means are semiconductor switches.

8. An auto-zero amplifier circuit as claimed in claim 7 wherein said semiconductor switches are metal oxide semiconductor field effect transistors.

9. An auto-zero amplifier circuit as claimed in claim 8 wherein said metal oxide semiconductor field effect transistors are N-channel exhancement type metal oxide semiconductor field effect transistors.

10. An auto-zero amplifier circuit as claimed in claim 8 including control means for controlling said metal oxide semiconductor field effect transistor switches such that said first and second metal oxide semiconductor field transistor switches are closed when said third metal oxide semiconductor field effect transistor switch is open and visa versa.

11. An auto-zero amplifier circuit as claimed in claim 10 wherein said control means switches said third metal oxide semiconductor field effect transistor off before switching said first and second metal oxide semiconductor field effect transistors on and switches said first and second metal oxide semiconductor field effect transistors off before switching said third metal oxide semiconductor field effect transistor on.

12. An auto-zero amplifier circuit as claimed in claim 11 wherein said control means includes:
(a) an underlap timing circuit for producing a pair of complementary control signals, said complementary control signals formed such that each of said signals shift from a predetermined first state to a second state prior to the other signal shifting from the second state to the first state;
(b) a first drive circuit coupled to receive one of said pair of complementary control signals and, in accordance therewith, control said first and second metal oxide semiconductor field effect transistors; and,
(c) a second drive circuit coupled to receive the other of said pair of complementary control signals and, in accordance therewith, control said third metal oxide semiconductor field effect transistor.

13. An auto-zero amplifier circuit as claimed in claim 4 wherein said first, second and third switch means are semiconductor switches.

14. An auto-zero amplifier circuit as claimed in claim 10 including control means for controlling said semiconductor switches such that said first and second semiconductor switches are closed when said third semiconductor switch is open and visa versa.

15. An auto-zero amplifier circuit as claimed in claim 14 wherein said control means switches said third semiconductor switch off before switching said first and second semiconductor switches on and switches said first and second semiconductor switches off before switching said third semiconductor switch on.

16. An auto-zero amplifier circuit as claimed in claim 15 wherein said control means includes:
(a) an underlap timing circuit for producing a pair of complementary control signals, said complementary control signals formed such that each of said signals shift from a predetermined first state to a second state prior to the other signal shifting from the second state to the first state;
(b) a first drive circuit coupled to receive one of said pair of complementary control signals and, in accordance therewith, control said first and second semiconductor switches; and,
(c) a second drive circuit coupled to receive the other of said pair of complementary control signals and, in accordance therewith, control said third semiconductor switch.

17. An auto-zero amplifier circuit as claimed in claim 3 wherein said storage means is a capacitor.

18. An auto-zero amplifier circuit as claimed in claim 17 wherein said first operational amplifier has an inverting terminal and a noninverting terminal and wherein said one terminal of said capacitor is connected to said noninverting terminal of said operational amplifier.

19. An auto-zero amplifier circuit as claimed in claim 18 wherein said first, second and third switch means are semiconductor switches.

20. An auto-zero amplifier circuit as claimed in claim 19 including control means for controlling said semiconductor switches such that said first and second semiconductor switches are closed when said third semiconductor switch is open and visa versa.

21. An auto-zero amplifier circuit as claimed in claim 20 wherein said control means switches said third semiconductor switch off before switching said first and second semiconductor switches on and switches said first and second semiconductor switches off before switching said third semiconductor switch on.

22. An auto-zero amplifier circuit as claimed in claim 21 wherein said control means includes:
   (a) an underlap timing circuit for producing a pair of complementary control signals, said complementary control signals formed such that each of said signals shift from a predetermined first state to a second state prior to the other signal shifting from the second state to the first state;
   (b) a first drive circuit coupled to receive one of said pair of complementary control signals and, in accordance therewith, control said first and second semiconductor switches; and,
   (c) a second drive circuit coupled to receive the other of said pair of complementary control signals and, in accordance therewith control said third semiconductor switch.

23. An auto-zero amplifier circuit as claimed in claim 3 wherein said first, second and third switch means are semiconductor switches.

24. An auto-zero amplifier circuit as claimed in claim 23 including control means for controlling said semiconductor switches such that said first and second semiconductor switches are closed when said third semiconductor switch is open and visa versa.

25. An auto-zero amplifier circuit as claimed in claim 24 wherein said control means switches said third semiconductor switch off before switching said first and second semiconductor switches on and switches said first and second semiconductor switches off before switching said third semiconductor switch on.

26. An auto-zero amplifier circuit as claimed in claim 25 wherein said control means includes:
   (a) an underlap timing circuit for producing a pair of complementary control signals, said complementary control signals formed such that each of said signals shift from a predetermined first state to a second state prior to the other signal shifting from the second state to the first state;
   (b) a first drive circuit coupled to receive one of said pair of complementary control signals and, in accordance therewith, control said first and second semiconductor switches; and,
   (c) a second drive circuit coupled to receive the other of said pair of complementary control signals and, in accordance therewith, control said third semiconductor switch.

27. An auto-zero amplifier circuit as claimed in claim 3 including control means for controlling said first, second and third switch means such that said first and second switch means are closed when said third switch means is open and visa versa.

28. An auto-zero amplifier circuit as claimed in claim 27 wherein said control means switches said third switch off before switching said first and second switches on and switches said first and second switches off before switching said third switch on.

29. An auto-zero amplifier circuit as claimed in claim 28 wherein said control means includes:
   (a) an underlap timing circuit for producing a pair of complementary control signals, said complementary control signals formed such that each of said signals shift from a predetermined first state to a second state prior to the other signal shifting from the second state to the first state;
   (b) a first drive circuit coupled to receive one of said pair of complementary control signals and, in accordance therewith, control said first and second switches; and,
   (c) a second drive circuit coupled to receive the other of said pair of complementary control signals and, in accordance therewith, control said third switch.

* * * * *